(12) United States Patent
Ker et al.

(10) Patent No.: US 7,242,561 B2
(45) Date of Patent: Jul. 10, 2007

(54) ESD PROTECTION UNIT WITH ABILITY TO ENHANCE TRIGGER-ON SPEED OF LOW VOLTAGE TRIGGERED PNP

(75) Inventors: Ming-Dou Ker, Hsin-chu County (TW); Chein-Ming Lee, Tai-Dong County (TW)

(73) Assignee: Silicon Integrated System Corp., Hsin-Chu (TW)

( * ) Notice: Subject to any disclaimer, the term of this patent is extended or adjusted under 35 U.S.C. 154(b) by 120 days.

(21) Appl. No.: 11/033,395

(22) Filed: Jan. 12, 2005

(65) Prior Publication Data

US 2006/0152868 A1    Jul. 13, 2006

(51) Int. Cl.
*H02H 9/00* (2006.01)

(52) U.S. Cl. .................................. 361/56; 257/355
(58) Field of Classification Search .................. 361/56
See application file for complete search history.

(56) References Cited

U.S. PATENT DOCUMENTS

| | | | | |
|---|---|---|---|---|
| 5,287,241 | A | 2/1994 | Puar | 361/56 |
| 5,311,391 | A | 5/1994 | Dungan | 361/56 |
| 5,530,612 | A | 6/1996 | Maloney | 361/56 |
| 5,576,557 | A | 11/1996 | Ker | 257/173 |
| 5,734,541 | A | 3/1998 | Iniewski | 361/111 |
| 5,959,820 | A | 9/1999 | Ker | 361/111 |
| 5,978,192 | A | 11/1999 | Young | 361/56 |
| 6,002,568 | A | 12/1999 | Ker | 361/111 |
| 6,011,681 | A | 1/2000 | Ker | 361/111 |
| 6,249,410 | B1* | 6/2001 | Ker et al. | 361/56 |
| 6,426,855 | B2 | 7/2002 | Lee | 361/56 |
| 6,521,952 | B1 | 2/2003 | Ker | 257/360 |
| 6,535,368 | B2 | 3/2003 | Andresen | 361/56 |
| 6,549,061 | B2 | 4/2003 | Voldman | 327/483 |
| 6,600,198 | B2* | 7/2003 | Ohnakado et al. | 257/357 |
| 6,690,557 | B2 | 2/2004 | Hung | 361/56 |
| 6,724,603 | B2* | 4/2004 | Miller et al. | 361/111 |
| 6,765,773 | B2 | 7/2004 | Reiner | 361/56 |
| 2003/0075763 | A1* | 4/2003 | Ker et al. | 257/355 |
| 2003/0076636 | A1* | 4/2003 | Ker et al. | 361/56 |
| 2004/0085691 | A1 | 5/2004 | Ker | 361/56 |

OTHER PUBLICATIONS

Ming-Dou Ker, Wei-jen Chang, Wen-Yu Lo. Low-Voltage-Triggered PNP Devices for ESD Protection Design in Mixed-Voltage I/O Interface with Over-VDD and Under-VSS Signal Levels. 2004. 0-7695-2093-6/04—IEEE (Computer Society). pp. 1-6.*

* cited by examiner

*Primary Examiner*—Stephen W. Jackson
*Assistant Examiner*—Luis E. Roman
(74) *Attorney, Agent, or Firm*—Troxell Law Office, PLLC

(57) ABSTRACT

The invention relates to an ESD protection with ability to enhance trigger-on speed of a low voltage Triggered PNP (LVTPNP) unit for protecting internal circuits of an integrated circuit from attack of an ESD stress. The ESD protection unit incorporates either detection circuit or power clamp circuit to efficiently trigger on a trigger node as a heavily doped region of LVTPNP devices among an I/O pad, a VDD pin and a VSS pin. As soon as the trigger node of each LVTPNP device receives a trigger signal from either the ESD detection circuit or power clamp circuit, the threshold voltage of the LVTPNP devices are capable of being therefore reduced to enhance trigger-on speed of the LVTPNP devices that discharge ESD current.

18 Claims, 8 Drawing Sheets

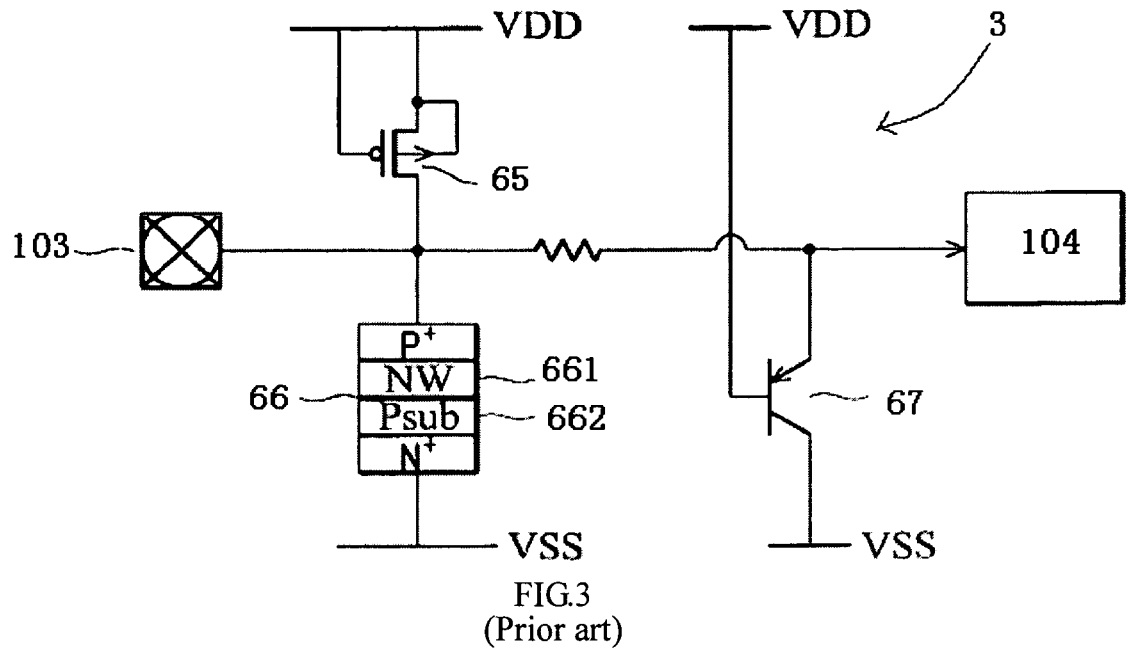
FIG.3
(Prior art)
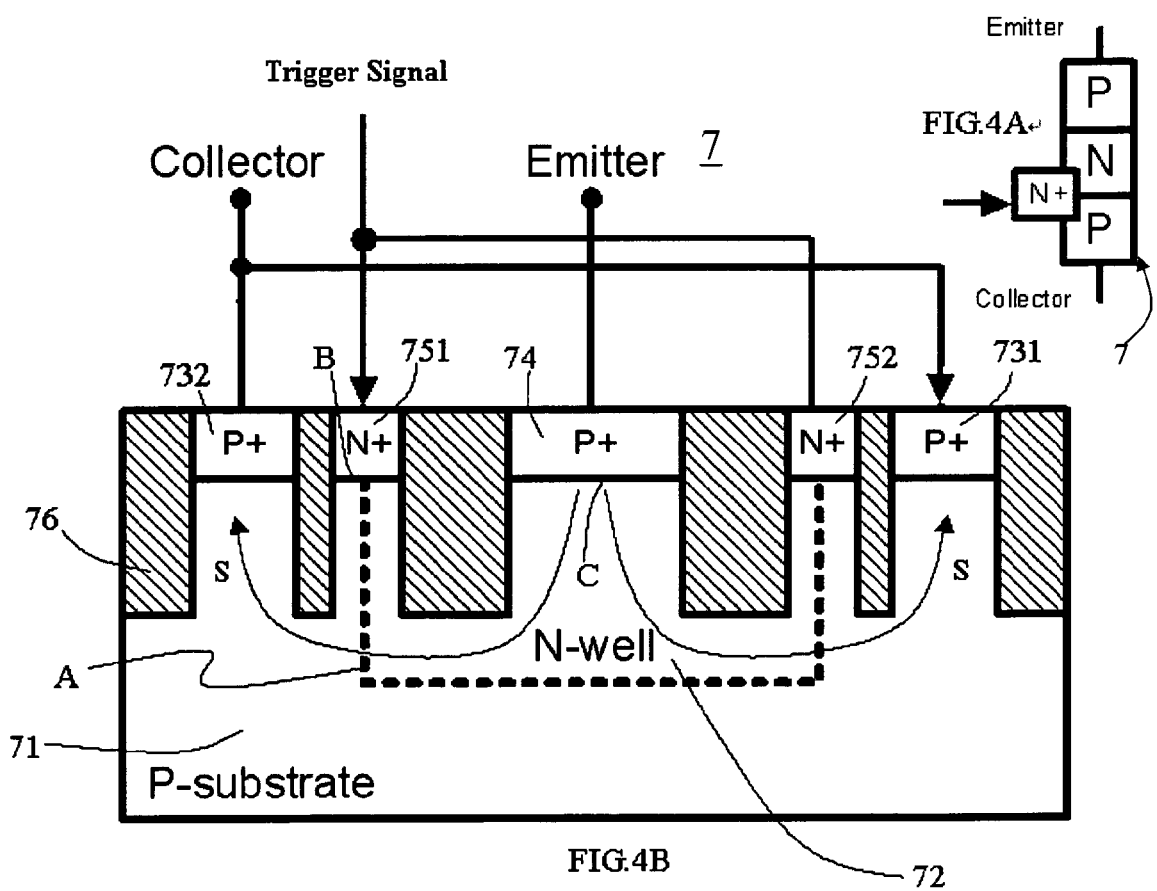
FIG.4A
FIG.4B

ESD PROTECTION UNIT WITH ABILITY TO ENHANCE TRIGGER-ON SPEED OF LOW VOLTAGE TRIGGERED PNP

BACKGROUND OF THE INVENTION

1. Field of the Invention

The present invention relates to an ESD protection unit, and particularly to an ESD protection unit capable of enhancing trigger-on speed of a low voltage Triggered PNP (LVTPNP) thereby achieving a better ESD performance.

2. Description of the Prior Art

As known, an ESD (Electrostatic Discharge) total-protection design is usually considered as one of the reliability for an integrated circuit (IC). Even through less ESD may cause serious damages on the integrated circuit. For example, during delivery process, such IC products are readily to suffer accidental attacks of various external static electricity, i.e. a HBM (Human Body Model) or MM (Machine Model) ESD stress. Generally speaking, each of the input and output pins of IC products has to sustain HBM ESD stress over ±2000V and MM ESD stress over ±200V. Therefore, ESD protection circuits need be disposed around the input and output (I/O) pads of the IC. Presently, a semiconductor circuit such as a CMOS with an on-chip ESD protection utilizing large amount of diodes or MOS transistors that occupy larger silicon areas. Furthermore, to overcome the high diode reverse-biased breakdown voltage and high MOS transistors holding voltage would cause the ESD protection inefficient.

FIGS. 1–3 are schematic circuit diagrams introducing three traditional ESD protection circuits.

In FIG. 1, the ESD protection device 1 includes two diodes 61, 62 connected between an input pad 103 and a high power supply VDD, and the input pad 103 and a low power supply VSS, respectively. The diode 61 is turned on by a positive ESD pulse across the input pad 103 that flows therefrom to the power supply VDD rather than to the internal circuit 104. Similarly, the diode 62 is turned on by a negative ESD pulse across the input pad 103 that flows therefrom to the power supply VSS rather than to the internal circuit 104.

In FIG. 2, the ESD protection device 2 includes a P-type MOS FET (Metal-oxide semiconductor Field-effect Transistor) 63 and N-type MOS FET 64. Operations of the ESD protection devices 1 and 2 are similar. The transistors 63 and 64 are turned on by a positive and negative ESD pulse across the input pad 103 that flows therefrom to the power supply VDD and VSS, respectively. This protects the internal circuit 104 from being damaged by ESD stress.

Generally speaking, the highest and lowest voltage levels of the input signals of integrated circuits are between the power supply voltages VDD and VSS. However, with the advance of the CMOS manufacturing process, ICs derived from different processes operate at different voltages. For example, the ICs derived from a 0.5 μm CMOS process operate at VDD of 5V, while those derived from a 0.18 μm CMOS process operate at VDD of 1.8V. On a single circuit board, there may be several ICs providing different functions and having I/O pads electrically connected with each other. Thus, each IC may receive I/O signals with different high and low voltage levels. For example, an IC using VDD of 1.8 or 3.3V may receive signals having a high voltage level of 5V output from another IC. This results in an input signal level higher than VDD. Similarly, some situations may cause an input signal lower than VSS. Moreover, in some ICs for network communication, such as ICs receiving signals from a remote device through connection lines, there may be input signals with voltage levels higher than VDD and lower than VSS. The previously described traditional ESD protection devices do not apply to an IC receiving input signals with voltage levels higher than VDD or lower than VSS since they induce leakage currents.

In FIG. 3, the ESD protection device is applicable to ICs receiving input signals with voltage levels lower than VSS. It includes a PNP bipolar junction transistor 67, a silicon controlled rectifier 66 and a PMOS transistor 65. Although this circuit provides ESD protection for ICs receiving input signals with voltage levels lower than VSS, the N well 661 is floated to prevent forward bias of the parasitic diode formed by the junction between the P substrate 662 and N well 661, which makes the silicon controlled rectifier 66 easy to be unintentionally triggered on. This results in latch-up issue to the circuit.

A low voltage triggered PNP (LVTPNP) technology disclosed in a pending U.S. patent application Ser. No. 10/383, 643 which now is a publication No. 2004/0085691, just provides an internal circuit with an ESD protection from input signals with voltage level either higher than $V_{DD}$ or lower than $V_{ss}$, by way of a floating region such as "N+" without usage of any other external trigger signal applied thereon. The disclosure of which is incorporated here. However, since the threshold voltage of the LVTPNP has a higher potential, therefore results in slowing down the conduction speed of the LVTPNP. The internal circuit is still easy to be directly damaged by the ESD stress if ESD current is not able to pass through the LVTPNP in time to the ground. Furthermore, the on-stage high voltage of the LVTPNP device facilitate heat energy rise and may burn itself out at last to result in lost in ESD protection.

Conventional ESD protection circuitry is located between the input pads and the ground potential, VSS and the high voltage, VDD. However, there continues to be a need to prevent damage to the internal circuitry from the increased power supply voltage associated with electrostatic discharge. Thus, it is necessary to design a power clamp circuit disposed between VDD and VSS.

As known, a variety of power clamp circuits have been widely used in ICs. These clamp circuits consist of a primary device to carry the current and a control circuit to condition the primary conduction device to conduct during an ESD event, but not conduct under normal IC operation. The primary conduction devices that have previously been used in CMOS ICs are the NMOS transistor, the PMOS transistor, and a special device called as silicon-controlled rectifier (SCR). Puar in U.S. Pat. No. 5,287,241 describes an ESD network using a PMOS clamp circuit. Ker in U.S. Pat. No. 6,011,681 used an SCR clamp. Each of these primary conduction devices has their respective advantages and disadvantages. The NMOS transistor has a high conductivity, but is itself susceptible to damage by the ESD event. The PMOS transistor is more rugged than the NMOS type, but the PMOS is less than half the conductivity per unit area when compared to the NMOS type. The SCR is both highly conductive and rugged, but difficult to appropriately control. Maloney in U.S. Pat. No. 5,530,612 discusses diodes that function as clamp circuits that result in parasitic PNP transistors for use between isolated power buses.

The clamp circuit requires that the control circuitry be relatively simple, spatially compact, electrically rugged, and also reliable, triggering the conduction of the primary conduction device only during the ESD event. The primary feature of most ESD control circuits is their use of the fast transient nature of the ESD event to trigger the conduction device. The control circuits switch the conducting device to the conducting state when the power bus to ground bus potential increases faster than a certain rate and the increase is greater than a certain value. In some cases, the clamp circuit may become conductive simply when a certain power bus to ground bus potential is exceeded. Dugan in U.S. Pat. No. 5,311,391 describes improvements to the control circuitry and thereby reaching minimum of triggering the ESD conducting device when the IC is in normal operation, but results in consuming additional area and circuit complexity.

SUMMARY OF THE INVENTION

It is an object of the present invention to provide an ESD protection unit incorporating an RC detection circuit to facilitate efficient trigger on of each of LVTPNP in I/O circuit of an integrated circuit under ESD stress, by way of lowering threshold voltage and enhancing trigger-on speed of the LVTPNP thereby achieving high ESD ability and less silicon area.

It is another object of the present invention to provide an ESD protection unit utilizing an ESD clamp circuit to facilitate efficient trigger-on of each of LVTPNP in power supply circuit of an integrated circuit under ESD stress by way of lowering threshold voltage and enhance trigger-on speed of the LVTPNP thereby achieving high ESD ability and less silicon area.

In order to achieve the above-mentioned objects, an ESD protection unit incorporating an RC detection circuit in accordance with an embodiment of the present invention, with an ESD path from an I/O pad to a high voltage node VDD pin and a low voltage node VSS pin, comprises a first ESD detection circuit respectively connecting to the I/O pad and an N-trigger LVTPNP with an emitter connecting to the VDD pin and a collector connecting to the I/O pad, a second ESD detection circuit respectively connecting to the I/O pad and a P-trigger LVTPNP with an emitter connecting to the I/O pad and a collector connecting to the VSS pin, and an isolation device interconnected between the collector of the N-trigger LVTPNP and the I/O pad.

Furthermore, the drain output of the first ESD detection circuit is connected to an N-trigger node of the LVTPNP. The N-trigger LVTPNP shuts down in a normal operation but is speedily triggered on by a higher potential-level output (now the voltage of the N-trigger node is lower than the collector) generated form the first ESD detection circuit in response to an ESD stress that occurs between the I/O pad and the VDD pin. The drain output of the second ESD detection circuit is connected to a P-trigger node of the LVTPNP device. The P-trigger LVTPNP shuts down in a normal operation but is speedily triggered on by a lower potential-level output (now the voltage of the P-trigger node is higher than the collector) generated from the second ESD detection circuit in response to an ESD stress that occurs between the I/O pad and the VSS pin. The isolation device is a diode with its negative node connected with the I/O pad and with its positive node connected with the collector of the N-trigger LVTPNP. The first and second ESD detection circuits each respectively comprise an RC delay circuit and an NMOS/a PMOS transistor controlled by said RC delay circuit.

An ESD protection unit incorporating power clamp circuit in accordance with another embodiment of the present invention for protecting a CMOS integrated internal circuit, at least part of which comprises a circuit high voltage power supply VDD pin and a ground supply VSS pin, comprises a trigger circuit coupled between the VDD pin and the VSS pin to detect a power supply voltage, and a LVTPNP device coupled between the VDD pin and the VSS pin. The trigger circuit is utilized to generate a trigger signal in response to an ESD stress that occurs between the VDD pin and the VSS pin. The LVTPNP device includes a trigger node connected to the output of the trigger circuit so that an ESD current between the VDD pin and the VSS pin can be discharged to the ground supply VSS by way of applying the trigger signal on the trigger node of the LVTPNP device. In Another embodiment, a plurality of diodes are capable of further being interconnected between the collector of the LVTPNP device and the VSS pin and/or between the emitter of the LVTPNP device and the VDD pin.

Hence, the ESD protection circuit according to the present invention, incorporating either an RC detection circuit or the ESD power clamp circuit to facilitate efficient trigger on of LVTPNP devices among the I/O pad, the VDD pin and the VSS pin. Each LVTPNP device can be speedily triggered on by way of applying a trigger signal from either an RC detection circuit or the ESD power clamp circuit on a trigger node of the LVTPNP device to reduce the threshold voltage of the LVTPNP devices upon an ESD stress occurs.

BRIEF DESCRIPTION OF THE DRAWINGS

FIGS. 1–3 are schematic circuit diagrams showing three traditional ESD protection circuits;

FIGS. 4A & 4B are schematic circuit diagrams showing an N-trigger type LVTPNP device used for ESD protection unit according to one of embodiments of the present invention;

DETAILED DESCRIPTION OF THE PREFERRED EMBODIMENTS

Figure 1:
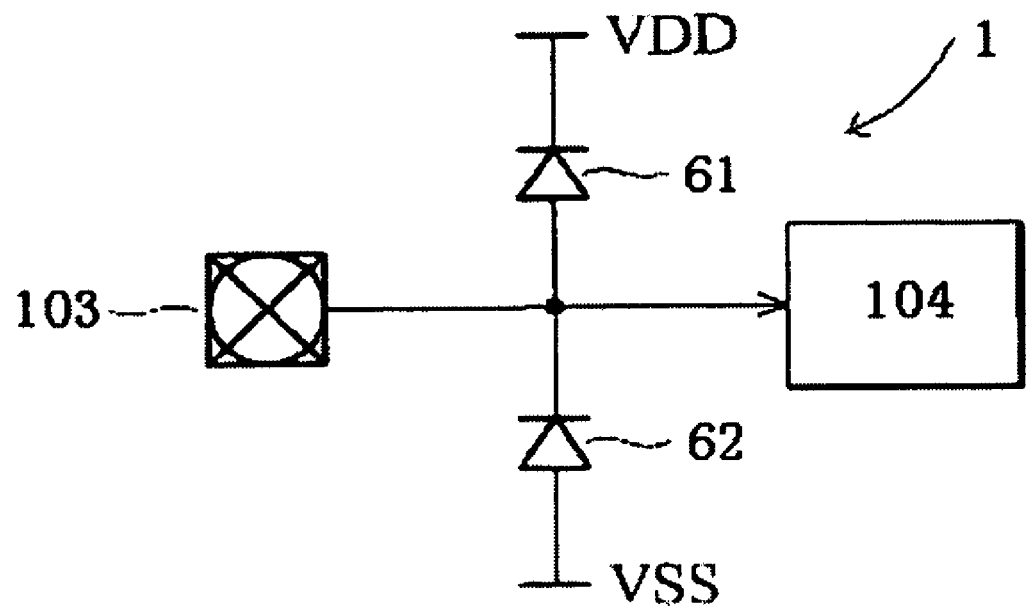
Figure 2:
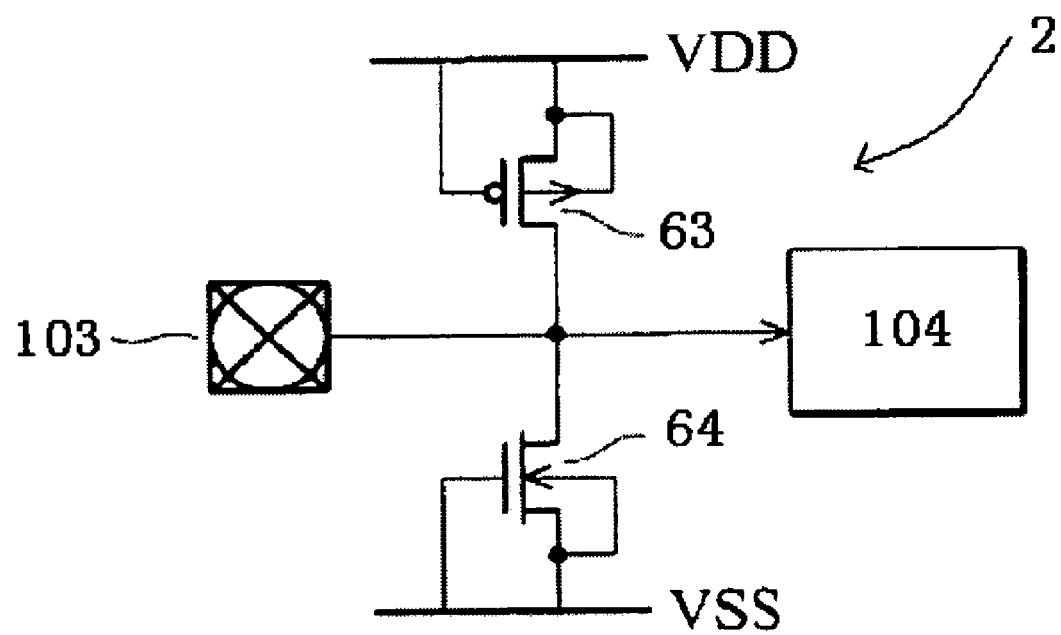

Please referring to FIGS. 4A & 4B, an N-trigger type LVTPNP device 7 is used for ESD protection devices according to several embodiments of the present invention. Meanwhile, a Path "S" denotes a discharge direction of an ESD current from an emitter to a collector of the LVTPNP upon an external trigger signal is applied on an "N+" node (an n-type heavily doped region) to enhance breakdown speed of an NP interface region "A" of the N-trigger type LVTPNP device. Regarding a structure of a conventional LVTPNP with a floating node such as "N" where is not applied by any external trigger signal, please refer to a disclosure of U.S. Patent application Publication No. 2004/0085691.

The N-trigger type LVTPNP 7 includes a P substrate 71, an N well 72 in the P substrate 71, P-type heavily doped regions 731 and 732 in the P substrate 71, a P-type heavily doped region 74 in the N well 72, N-type heavily doped regions 751 and 752 adjacent to the N well 72, and isolation layers 76 isolating the doped regions 731, 732, 74, 751 and 752. Thus formed, the structure is equivalent to a PNP bipolar junction transistor with a low breakdown voltage. It provides a current path between the emitter and collector when the PN or NP junction avalanches. The emitter is formed with the P-type heavily doped region 74. The base is formed with the N well 72, and N-type heavily doped regions 751 and 752. The collector is formed with the P substrate 71 and the P-type heavily doped regions 731 and 732. The N-type heavily doped regions 751 and 752 form a N-trigger node.

Those skilled in the art will appreciate that the P-type heavily doped regions 731 and 732 are used as contact regions coupling the P substrate 71 to another element or to receive a voltage level. On the contrary, the P-type heavily doped region 74 electrically isolates the P-type heavily doped regions 731 and 732 from other elements. Thus, only the PN or NP junction may be forward biased when there is no ESD pulse to eliminate leakage current. Moreover, the junction C has a low breakdown voltage since the region 74 is heavily doped, while the junction A has a relatively high breakdown voltage since both the N well 72 and P substrate 71 are lightly doped. The junction A is disadvantageous to formation of the ESD current path. Fortunately, the N-type heavily doped regions 751 and 752 compensate for this disadvantage. The junction B has a low breakdown voltage due to the heavily doped regions 751 and 752, which avalanches earlier than the junction A when the ESD pulse zapping on the I/O pad. As soon as there is a trigger signal (i.e. a current with higher potential-level output) applied on the heavily doped regions 751 and 752 (N-trigger node), the voltage of the heavily doped regions 751 and 752 is higher than that of the P-type heavily doped regions 732 and 731 instantaneously, and thus enhances breakdown speed of junction A.

P-trigger type and other types of the LVTPNP devices are similar to the N-trigger type LVTPNP 7. Oppositely, the conventional LVTPNP device according to said U.S. Patent application Publication No. 2004/0085691 lacks an external trigger signal applied thereon to timely break down its junction A due to a threshold voltage with a higher potential as aforementioned.

Figure 5:
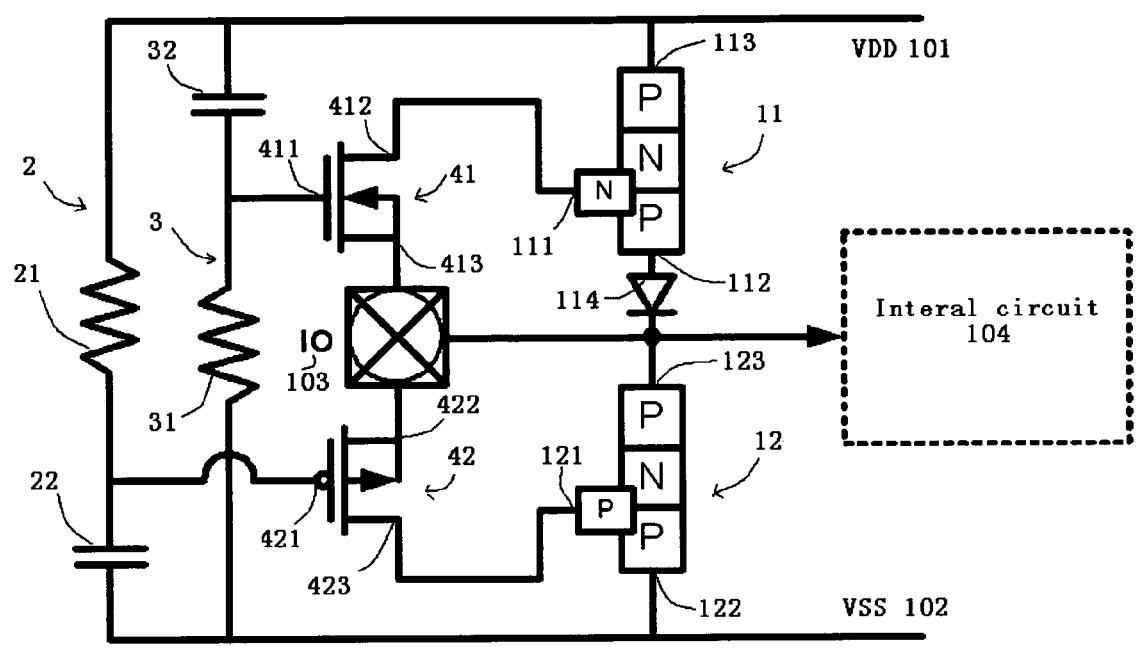
FIG. 5 is a schematic circuit diagram of an ESD protection unit incorporating an RC detection circuit according to a first embodiment of the present invention.

Please refer to FIG. 5, an ESD protection unit 5 incorporates detection circuits in accordance with a first embodiment of the invention. An I/O pad 103 provides electrical signals to an internal circuit 104. Each of said detection circuits respectively includes an RC delay 2, 3 and a gate-coupled circuit 41, 42. The principle of the RC delays 2, 3 is used to distinguish ESD-zapping events from the normal circuit operation conditions. The gate-coupled circuits 41, 42 as a P-MOS and N-MOS transistor are respectively controlled by said corresponding RC delays 2, 3 to generate a trigger current to speedily turn on of two different LVTPNP devices 11, 12 during ESD-zapping conditions.

On the upper part of the ESD protection circuit 5 as shown in FIG. 5, a drain 412 of the N-MOS transistor 41 is connected to an n-trigger node 111 of an n-trigger node of the LVTPNP device 11. A gate 411 of the N-MOS transistor 41 is interconnected between a VDD pin 101 and VSS pin 102 through the RC delay 3 including of a capacitor 32 and a resistor 31. A source 413 of the N-MOS transistor 41 is connected to the I/O pad 103. The capacitor 32 is one of various kinds of capacitors, e.g. PMOS, NMOS, MIM (Metal-Insulator-Metal), Varator, etc.

An emitter 113 of the LVTPNP device 11 is connected to the VDD PIN 101 and a collector 112 of the LVTPNP device 11 is connected to the I/O pad 103 through a diode 114. Because the collector 112 (P substrate) is connected the VSS pin 102 and biased at low voltage, so the diode 114 functions as isolating the collector 112 from the I/O pad 103. In normal operation conditions, the diode 114 ensures the N-type LVTPNP device 11 to shut down and has no leakage current.

Similar to the upper part of the circuit, a drain 423 of the P-MOS transistor 42 is connected to a P-trigger node 121 of the LVTPNP device 12 on the lower part of the ESD protection circuit 5 as shown in FIG. 5. The gate 421 of the P-MOS transistor 42 is connected to the VDD pin 101 through a resistor 21 and connected to the VSS pin 102 through a capacitor 22. The source 422 of the P-MOS transistor 42 is connected to the I/O pad 103 directly. The emitter 123 of the LVTPNP device 12 is connected to the I/O pad 103 and the collector 122 is connected to the VSS pin 102.

In the normal circuit operating conditions with VDD and VSS power supplies, the input gate 411 of the N-MOS transistor 41 is biased at VSS. Therefore, the output of the drain 412 is biased at VDD whenever the input signal of the I/O PAD 103 is logic high (VDD) or logic low (VSS). The N-trigger node 111 of the LVTPNP device 11 is kept at VDD by the output of the drain 412 of the N-MOS transistor 41, so the N-trigger LVTPNP device is guaranteed to be kept off in the normal circuit operating conditions. The input gate 421 of the P-MOS transistor 42 is biased at VDD. Thus, the output of the drain 423 of the P-MOS transistor 42 is biased at VSS. The P-trigger node 121 of the LVTPNP device 12 is kept at VSS by the output of the drain 423, so the P-trigger LVTPNP device 12 is guaranteed to be kept off in the normal circuit operating conditions.

An ESD energy applied on the I/O PAD 103 may have the positive or negative voltage with reference to the grounded VDD pin 101 or the VSS pin 102, so there are four modes of ESD stresses at each I/O PAD of CMOS IC products, includes a PS mode (a positive voltage pulse relative to the VSS pin 102 is applied to the I/O PAD 103), an NS mode (a negative voltage pulse relative to the VSS pin 102 is applied to the I/O PAD 103), a PD mode (a positive pulse voltage relative to the VDD pin 101 is applied to the I/O PAD 103), an ND mode (a negative pulse voltage relative to the VDD pin 101 is applied to the I/O PAD 103).

Under the PS mode ESD-zapping condition, the input gate 421 of the P-MOS transistor 42 is initially floating with a zero voltage level by the Relay 2, thereby the output of the drain 423 of the P-MOS transistor 42 will be turned on due to the positive ESD voltage on the I/O PAD 103. So, the output of the P-MOS transistor 42 is charged up by the ESD energy to generate the trigger signal (higher potential-level output) into the P-trigger node 121 of the P-trigger LVTPNP device 12. The voltage of the P-trigger node 121 is higher than that of the collector 122 instantaneously. Therefore, the P-trigger LVTPNP device 12 is triggered on and the ESD current is discharged from the I/O PAD 103 to the grounded VSS pin 102 through the P-trigger LVTPNP device 12, the RC time constant is designed to keep the input of the gate 421 at a relatively low-voltage level during ESD stress condition.

Under the ND mode ESD-zapping condition, the input gate 411 of the N-MOS transistor 41 is initially floating with a high voltage level by the relay 3, thereby the N-MOS transistor 41 will be turned on due to the negative ESD voltage on the I/O PAD 103. So, the output of the drain 412 of the N-MOS transistor 41 is pulled down by the negative ESD voltage to draw the trigger signal (lower potential-level output) out from the N-trigger LVTPNP device 11. The voltage of the N-trigger node 111 is higher than that of the collector 112 instantaneously. Therefore, the N-trigger LVTPNP device 11 is triggered on and the negative ESD current is discharged from the VDD pin 101 to the I/O pad 103 through the N-trigger LVTPNP device 11 and the diode 114.

When the NS mode ESD stress is applied to the circuit, the ESD current is discharged form VSS pin 102 to the I/O pad 103 through the LVTPNP device 12. When the PD mode ESD stress is applied to the circuit, the ESD current is discharged form the I/O pad 103 to the VDD pin 101 through the LVTPNP device 11.

Figure 6:
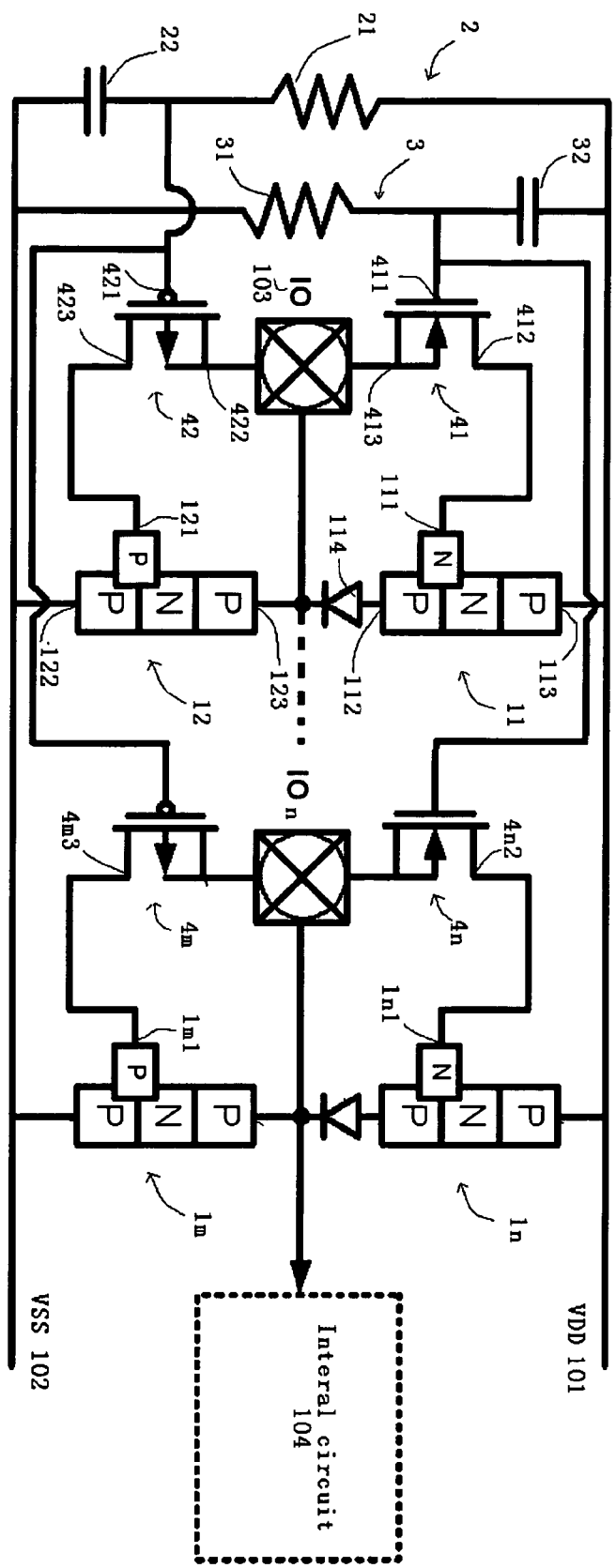
FIG. 6 is a schematic circuit diagram of ESD protection unit incorporating an RC detection circuit according to a second embodiment of the present invention.

FIG. 6 is a diagram showing another embodiment of ESD protection unit according to the present invention. The circuit shown in FIG. 6 is similar to that shown in FIG. 5, except that there are a plurality of I/O PADs IO1~IOn. Each I/O PAD has an N-trigger LVTPNP device 1n connecting to the VDD pin 101 and a P-trigger LVTPNP device 1m connecting to the VSS pin 102. Each N-trigger LVTPNP device has an N-trigger node 1n1 connecting to a drain 4n2 of an n-MOS transistor 4n and each P-trigger LVTPNP device 1m has a P-trigger node 1m1 connecting to a drain 4m3 of a P-MOS transistor 4m. All of the N-MOS transistors share an RC delay and all of the P-MOS transistors share an RC delay, such that the area occupied by the ESD protection is minimized.

Figure 7:
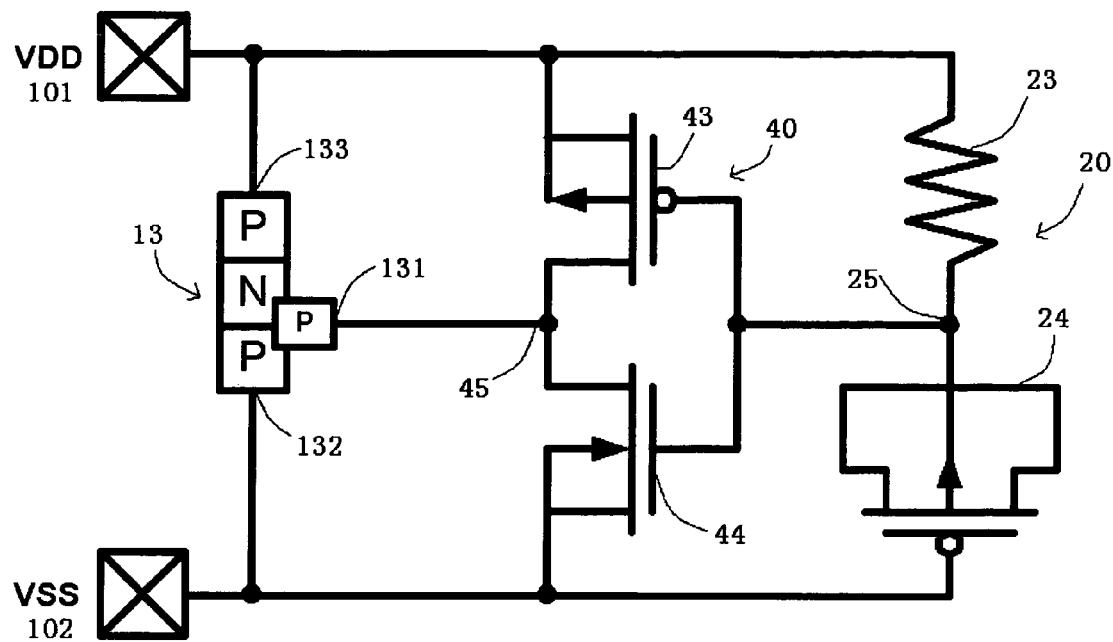
FIG. 7 is a schematic circuit diagram of an ESD protection unit incorporating an ESD clamp according to a first embodiment of the present invention.

FIG. 7 shows an ESD power clamp circuit according to a first embodiment of the invention. The VDD pin 101 is connected with the VSS pin 102 through an RC delay 20. The RC delay 20 comprises a resistor 23 connected to the VDD pin 101 and a capacitor 24 connected to the VSS pin 102. The output of the RC delay 20 is input into the inverter 40. The inverter 40 is made by CMOS process and comprises a PMOS transistor 43 and an NMOS transistor 44. A P-trigger LVTPNP device 13 has a P-trigger node 131 connected to an output node 45 of the inverter 40. The emitter 133 of the P-trigger LVTPNP device 13 is connected to the VDD pin 101 and the collector (P substrate) 132 is connected to the VSS pin 102. In normal operation conditions, the output node 25 of the RC delay 20 is biased at VDD and the output node 45 of the inverter 40 is biased at VSS. Thus, the P-trigger LVTPNP device 12 is guaranteed to be kept off in the normal circuit operating conditions. When a positive ESD stress is zapping on the VDD pin 101, the output node 25 of the RC delay 20 is biased at low voltage. Thus, the output node 45 of the inverter 40 is biased at VDD and the LVTPNP device 13 is triggered on. The positive ESD current is discharged from the VDD pin 101 to the VSS pin 102 through the P-trigger LVTPNP device 7, and will not be inputted into the internal circuit (not shown).

Figure 8:
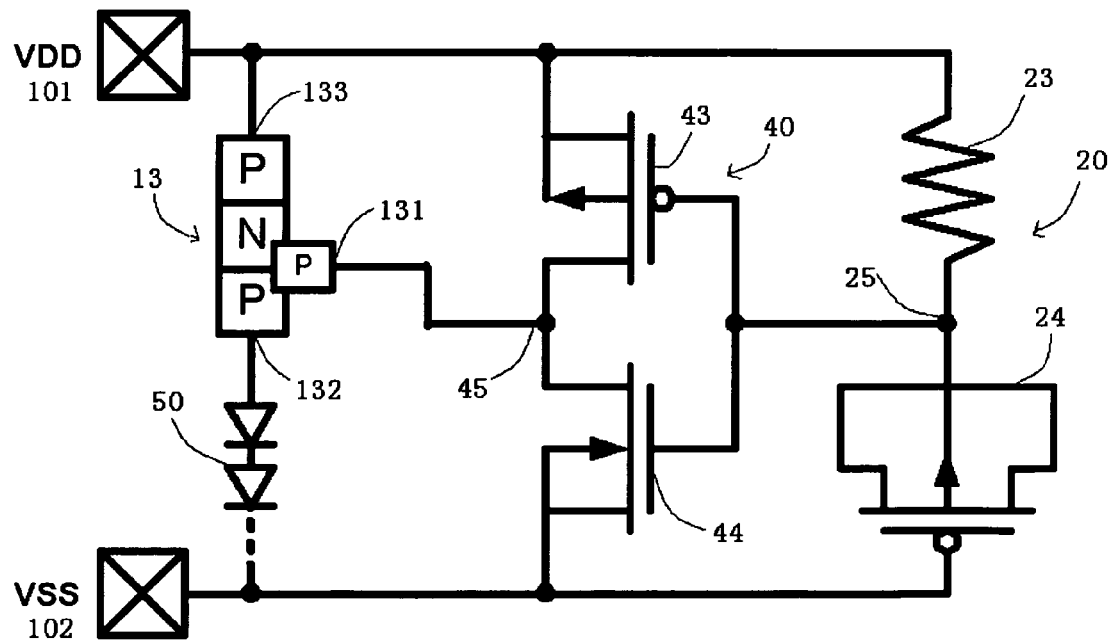
FIG. 8 is a schematic circuit diagram of an ESD protection unit incorporating an ESD clamp circuit according to a second embodiment of the present invention.

FIG. 8 is a diagram showing an ESD clamp circuit according to a second embodiment of the invention. The same elements in FIGS. 7 and 8 are designated by the same reference numerals for clarity. It is noted that there are a plurality of diodes 50 connected between the collector 132 of the LVTPNP device 13 and the VSS pin 102. The diodes 50 increase holding voltage of the clamp circuit.

Figure 9:
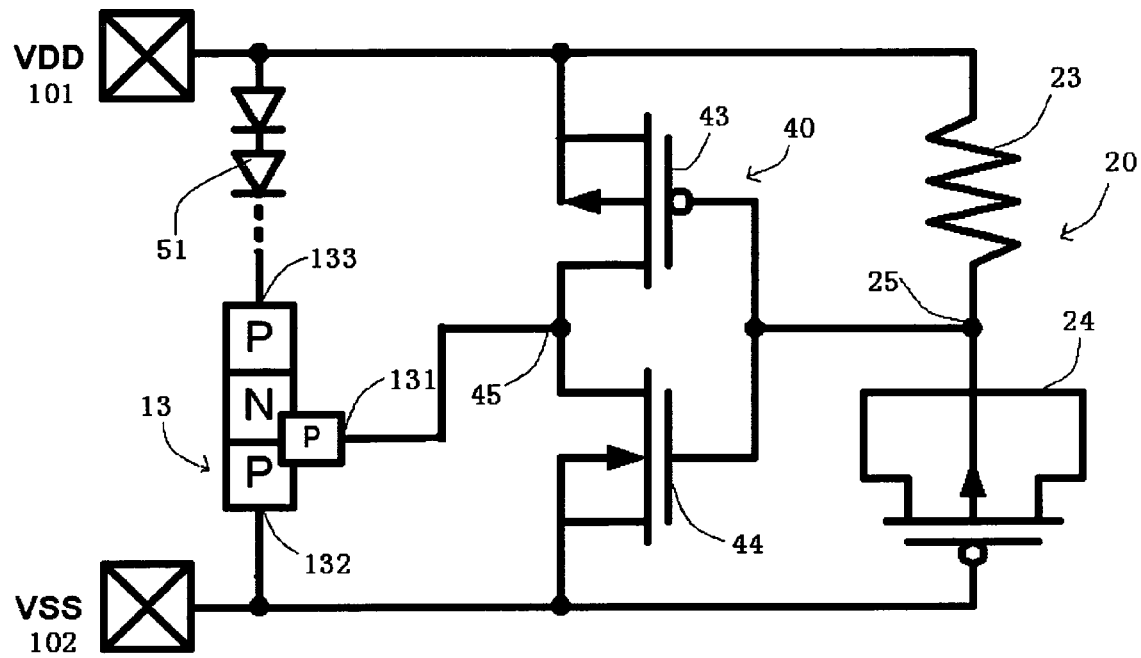
FIG. 9 is a schematic circuit diagram of an ESD protection unit incorporating an ESD clamp circuit according to a third embodiment of the present invention.

FIG. 9 is a diagram showing an ESD clamp circuit according to a third embodiment of the invention. The same elements in FIGS. 7 and 9 are designated by the same reference numerals for clarity. It is noted that there are a plurality of diodes 51 connected between the emitter 133 of the LVTPNP device 13 and the VDD pin 101. The diodes 51 increase holding voltage of the clamp circuit.

Figure 10:
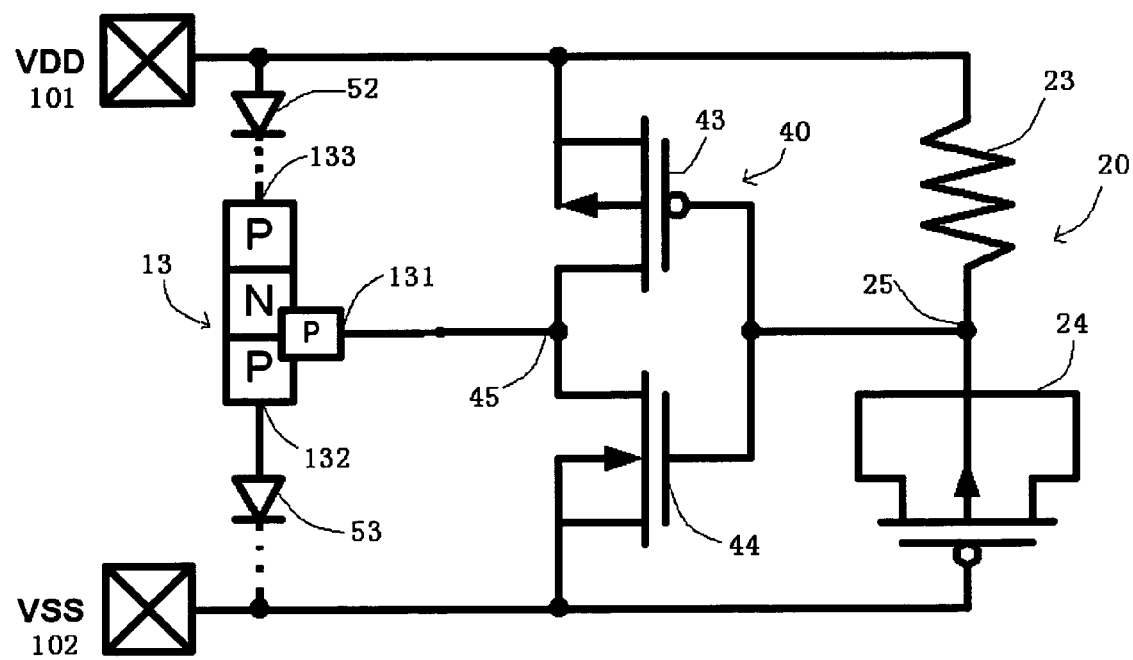
FIG. 10 is a schematic circuit diagram of an ESD protection unit incorporating an ESD clamp circuit according to a fourth embodiment of the present invention.

FIG. 10 is a diagram showing an ESD clamp circuit according to a fourth embodiment of the invention. The same elements in FIGS. 7 and 10 are designated by the same reference numerals for clarity. It is noted that there are a plurality of diodes 52 connected between the emitter 133 of the LVTPNP device 13 and the VDD pin 101 and a plurality of diodes 53 connected between the P-substrate of the LVTPNP device 13 and the VSS pin 102. The diodes 52, 53 increase holding voltage of the clamp circuit.

Figure 11:
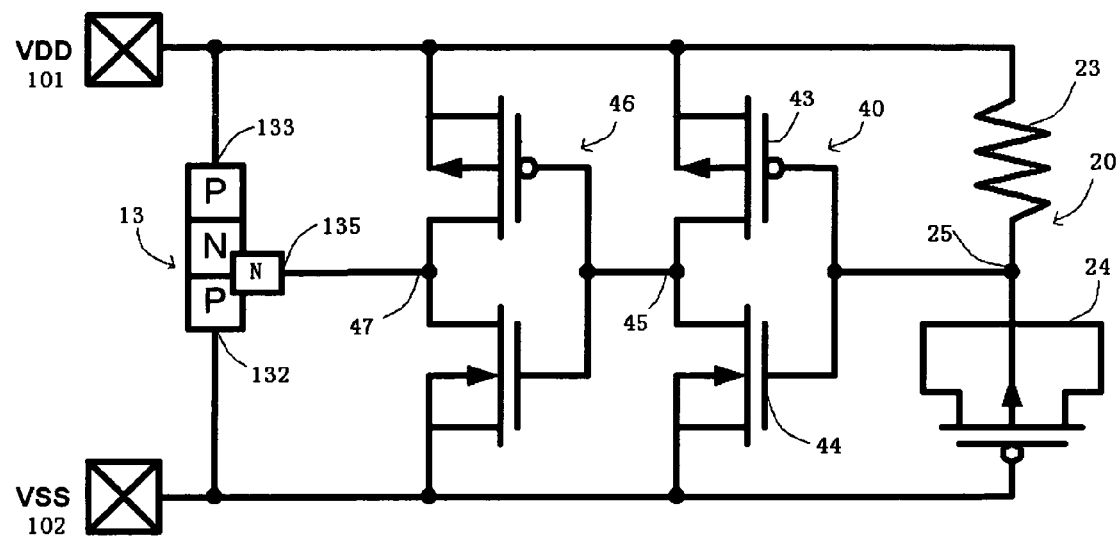
FIG. 11 is a schematic circuit diagram of an ESD protection unit incorporating an ESD clamp circuit according to a fifth embodiment of the present invention.

FIG. 11 is a diagram showing an ESD clamp circuit according to a fifth embodiment of the invention. The same elements in FIGS. 7 and 11 are designated by the same reference numerals for clarity. It is noted that the LVTPNP device 13 is N-trigger type and there are two inverters 40, 46 between RC delay 20 and the N-trigger node 135. In normal operation conditions, the output node 25 is biased at VDD and the output node 45 of the inverter 40 is biased at VSS and thus the output node 47 of the second inverter 46 is biased at VDD. Thus, the N-trigger LVTPNP device 12 is guaranteed to be kept off in the normal circuit operating conditions. When a positive ESD zaps on the VDD pin 101, the input node 25 of the inverter 40 is biased at a low voltage. The output node 45 of the inverter 40 is biased at VDD and the output node 47 of inverter 46 is biased at VSS. Thus, the LVTPNP device 12 is triggered on. The positive ESD current is discharged from the VDD pin 101 to the VSS pin 102 through the N-trigger LVTPNP device 13.

Figure 12:
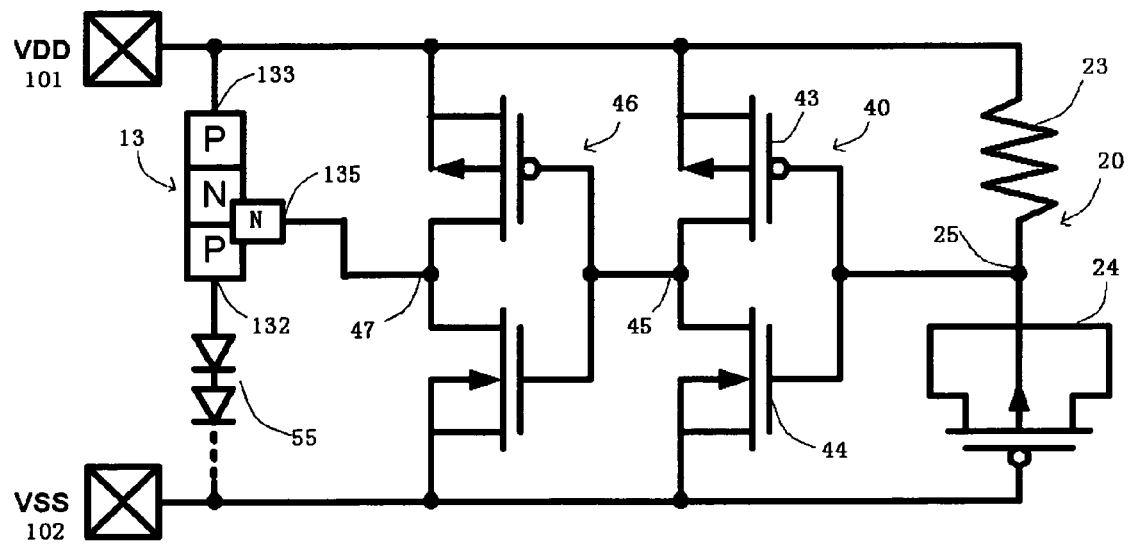
FIG. 12 is a schematic circuit diagram of an ESD protection unit incorporating an ESD clamp circuit according to a sixth embodiment a of the present invention.

FIG. 12 is a diagram showing an ESD clamp circuit according to a sixth embodiment of the invention. The same elements in FIGS. 7 and 12 are designated by the same reference numerals for clarity. It is noted that there are a plurality of diodes 50 connected between the collector 132 of the LVTPNP device 13 and the VSS pin 102. The diodes 55 increase holding voltage of the clamp circuit.

Figure 13:
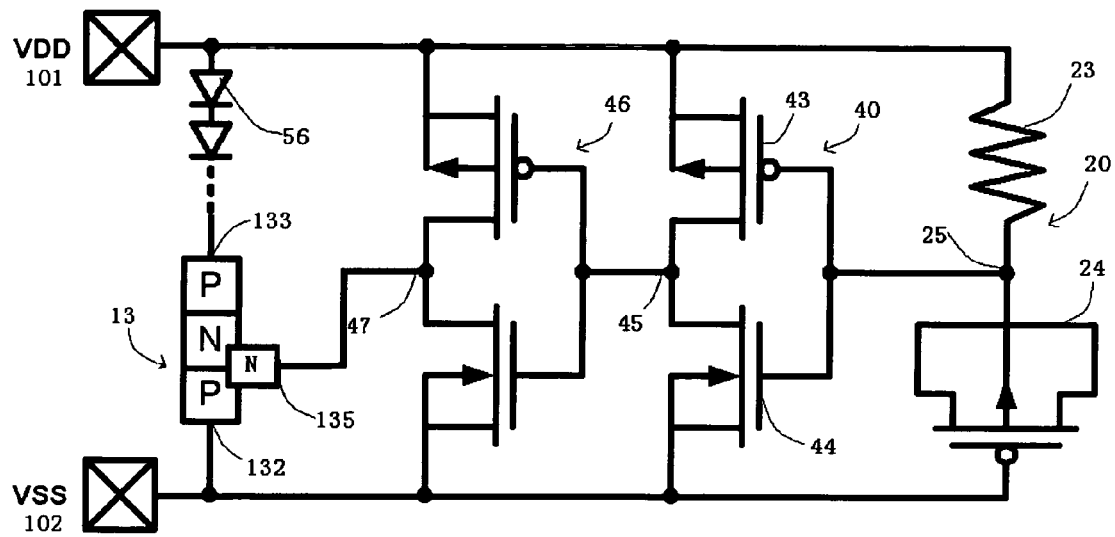
FIG. 13 is a schematic circuit diagram of an ESD protection unit incorporating an ESD clamp circuit according to a seventh embodiment of the present invention.

FIG. 13 is a diagram showing an ESD clamp circuit according to a seventh embodiment of the invention. The same elements in FIGS. 7 and 13 are designated by the same reference numerals for clarity. It is noted that there are a plurality of diodes 56 connected between the emitter 133 of the LVTPNP device 13 and the VDD pin 101. The diodes 56 increase holding voltage of the clamp circuit.

Figure 14:
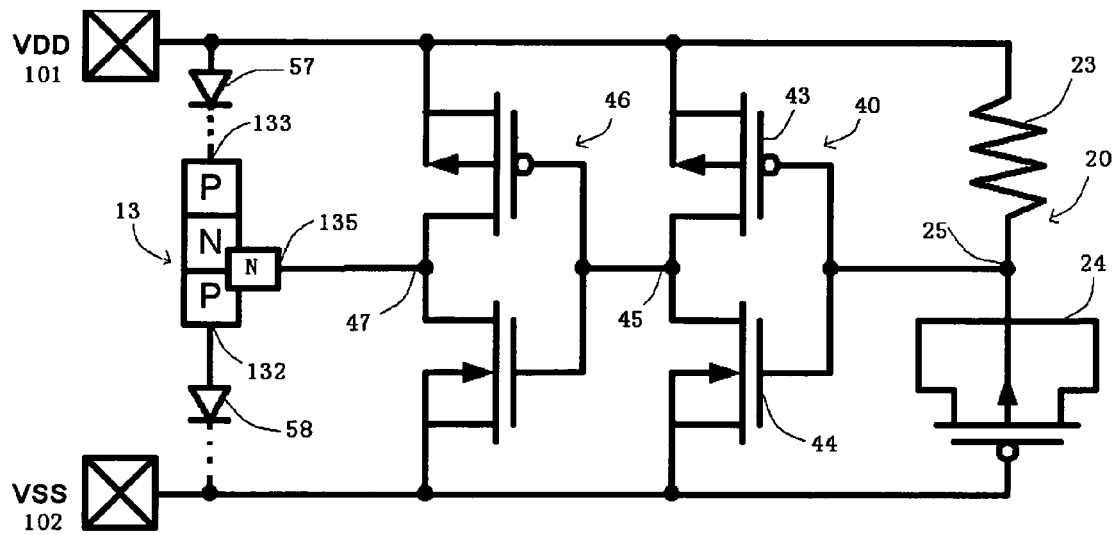
FIG. 14 is a schematic circuit diagram of an ESD protection unit incorporating an ESD clamp circuit according to an eighth embodiment of the present invention.

FIG. 14 is a diagram showing an ESD clamp circuit according to an eighth embodiment of the invention. The same elements in FIGS. 7 and 14 are designated by the same reference numerals for clarity. It is noted that there are a plurality of diodes 57 connected between the emitter 133 of the LVTPNP device 13 and the VDD pin 101 and a plurality of diodes 58 connected between the collector 132 of the LVTPNP device 13 and the VSS pin 102. The diodes 57, 58 increase holding voltage of the clamp circuit.

The ESD protection unit according to the present invention incorporates LVTPNP devices among the I/O pad, the VDD pin and the VSS pin. Each LVTPNP device can receive a trigger signal generated from either an ESD detecting circuit or power clamp circuit to a trigger node of the LVTPNP device thereby reducing the threshold voltage of the LVTPNP devices and enhancing trigger-on speed of the LVTPNP devices are increased upon an ESD stress occurs.

What is claimed is:

1. An electrostatic discharge (ESD) protection unit for providing an ESD path from an input/output (I/O) pad to either a high voltage node VDD pin or a low voltage node VSS pin, the unit comprising:
   a first ESD detection circuit connecting to the I/O pad;
   an N-trigger low voltage triggered PNP (LVTPNP) device including an emitter connecting to the VDD pin, a collector connecting to the I/O pad, and an N-trigger node connecting to an output of the first ESD detection circuit wherein the N-trigger LVTPNP device shuts down in a normal operation and is speedily triggered on by way of a higher potential-level output applied by the first ESD detection circuit on the N-trigger node of the LVTPNP device upon an ESD stress occurs between the I/O pad and the VDD pin;
   a second ESD detection circuit connecting to the I/O pad; and
   a P-trigger LVTPNP device including an emitter connecting to the I/O pad, a collector connecting to the VSS pin, and an P-trigger node connecting to an output of the second ESD detection circuit wherein the P-trigger LVTPNP device shuts down in a normal operation and is speedily triggered on by a lower potential-level output applied from the first ESD detection circuit on the P-trigger node of the LVTPNP device upon an ESD stress occurs between the I/O pad and the VSS pin.

2. The ESD protection unit as claimed in claim 1, further comprising: an isolation device connected between the collector of the N-trigger LVTPNP device and the I/O pad.

3. The ESD protection unit as claimed in claim 1, wherein the first ESD detection circuit comprises a first RC delay and an NMOS transistor.

4. The ESD protection unit as claimed in claim 3, wherein the first RC delay has a first capacitor connected to the VDD pin and a first resistor connected to the VSS pin.

5. The ESD protection unit as claimed in claim 4, wherein a gate of the N-MOS transistor connecting to the VDD pin through the first capacitor and connecting to the VSS pin through the first resistor, a source of the N-MOS transistor connecting to the I/O pad, and a drain of the NMOS connecting to the N-trigger node of the N-trigger LVTPNP device.

6. The ESD protection unit as claimed in claim 4, wherein said first capacitor can be one of various kinds of capacitors including a PMOS, NMOS, MIM, and varator.

7. The ESD protection unit as claimed in claim 3, wherein the second ESD detection circuit comprises a second RC delay and a PMOS transistor.

8. The ESD protection unit as claimed in claim 7, wherein the second RC delay has a second capacitor connected to the VSS pin and a second resistor connected to the VDD pin.

9. The ESD protection unit as claimed in claim 8, wherein a gate of the PMOS transistor connects to the VSS pin through the second capacitor and connecting to the VDD pin through the second resistor, a source of the PMOS transistor connecting to the I/O pad, a drain of the NMOS connecting to the P-trigger node of the P-trigger LVTPNP device.

10. An electrostatic discharge (ESD) protection unit for providing ESD paths from a plurality of input/output (I/O) pads either to a high voltage node VDD pin or a low voltage node VSS pin, the unit comprising:
    a first ESD detection circuit connecting to the I/O pads, having a first RC delay interconnected between the VDD pin and the VSS pin, and a plurality of N-MOS transistors each having a gate connecting to said first RC delay, and a source connecting to a corresponding I/O pad;
    a plurality of N-trigger low voltage triggered PNP (LVTPNP) devices each including an emitter connecting to the VDD pin, a collector connecting to a corresponding I/O pad, and an N-trigger node connecting to a drain of a corresponding NMOS transistor wherein the N-trigger LVTPNP devices shut down in a normal operation and are speedily triggered on by a higher potential-level output of the first ESD detection circuit when an ESD stress occurs between the corresponding I/O pad and the VDD pin;
    a second ESD detection circuit connecting to the I/O pads, having a second RC delay interconnected between the VSS pin and the VDD pin, and a plurality of PMOS transistors each having a gate connecting to said second RC delay, and a source connecting to a corresponding I/O pad; and
    a plurality of P-trigger LVTPNP devices each including an emitter connecting to a corresponding I/O pad, a collector connecting to the VSS pin, and a P-trigger node connecting to a drain of the corresponding PMOS transistor wherein the P-trigger LVTPNP devices shut down in a normal operation and are speedily triggered on by a lower potential-level output of the first ESD detection circuit when an ESD stress occurs between the corresponding I/O pad and the VSS pin.

11. An electrostatic discharge (ESD) protection unit for an integrated circuit, at least part of which comprises a circuit high voltage power supply VDD pin and a ground supply VSS pin, comprising:
    a trigger circuit coupled between the VDD pin and the VSS pin to detect a power supply voltage thereby generating a trigger signal upon an ESD stress occurs between the VDD pin and the VSS pin; and
    a low voltage triggered PNP (LVTPNP) device coupled between the VDD pin and the VSS pin, having an trigger node connected to an output of the trigger circuit wherein the LVTPNP device conducts ESD current between the VDD pin and the VSS pin in response to the trigger signal.

12. The ESD protection unit as claimed in claim 11, wherein the LVTPNP device includes an emitter connected to the VDD pin and a collector connected to the VSS pin.

13. The ESD protection unit as claimed in claim 11, wherein the trigger circuit is cooperated with a power clamp circuit.

14. The ESD protection unit as claimed in claim 11, wherein the trigger circuit comprises an RC delay having a resistor connected to the VDD pin and a capacitor connected to VSS, and an inverter receiving an output of the RC delay and outputting the trigger signal to the LVTPNP devices as soon as the LVTPNP device is P-trigger type.

15. The ESD protection unit as claimed in claim 11, wherein the trigger circuit comprises an RC delay having a resistor connected to the VDD pin and a capacitor connected to the VSS pin, and a couple of inverters receiving an output of the RC delay and outputting the trigger signal to the LVTPNP device as soon as the LVTPNP device is N-trigger type.

16. The ESD protection unit as claimed in claim 11, further comprising a plurality of diodes connected between the collector of the LVTPNP device and the VSS pin.

17. The ESD protection unit as claimed in claim 11, further comprising a plurality of diodes connected between the emitter of the LVTPNP device and the VDD pin.

18. The ESD protection unit as claimed in claim 11, further comprising a plurality of diodes connected between the emitter of the LVTPNP device and the VDD pin and a plurality of diodes connected between the P-substrate of the LVTPNP device and the VSS pin.

* * * * *